(12) United States Patent  
Park

(10) Patent No.: US 7,737,446 B2  
(45) Date of Patent: Jun. 15, 2010

(54) THIN FILMS TRANSISTOR ARRAY SUBSTRATE AND FABRICATING METHOD THEREOF

(75) Inventor: Jae Hong Park, Kyoungsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 22 days.

(21) Appl. No.: 10/963,548

(22) Filed: Oct. 14, 2004

(65) Prior Publication Data
US 2005/0133787 A1 Jun. 23, 2005

(30) Foreign Application Priority Data
Dec. 17, 2003 (KR) ...................... 10-2003-0092703

(51) Int. Cl.
*H01L 31/0392* (2006.01)
(52) U.S. Cl. .................. 257/72; 257/59; 257/E29.117; 349/42; 349/43
(58) Field of Classification Search .................. 257/59, 257/72, E29.117; 349/42–48
See application file for complete search history.

(56) References Cited

U.S. PATENT DOCUMENTS

| 6,414,730 | B1 * | 7/2002 | Akamatsu et al. ............. | 349/43 |
| 6,441,401 | B1 * | 8/2002 | Jung et al. .................... | 257/72 |
| 6,664,569 | B2 | 12/2003 | Moon .......................... | 257/72 |
| 2001/0050368 | A1 * | 12/2001 | Moon .......................... | 257/72 |
| 2002/0063253 | A1 * | 5/2002 | Hong et al. ................... | 257/59 |
| 2002/0109799 | A1 * | 8/2002 | Choi et al. .................... | 349/43 |
| 2002/0180901 | A1 | 12/2002 | Kim ............................ | 349/43 |
| 2004/0099865 | A1 * | 5/2004 | Tak et al. ...................... | 257/72 |

* cited by examiner

*Primary Examiner*—Wael Fahmy
*Assistant Examiner*—Abul Kalam
(74) *Attorney, Agent, or Firm*—Morgan Lewis & Bockius LLP

(57) ABSTRACT

A thin film transistor array substrate includes: a gate line provided on a substrate; a data line crossing the gate line; and a thin film transistor having a source electrode that is a portion of the data line that crosses the gate line and a drain electrode overlapping the gate line.

8 Claims, 11 Drawing Sheets

THIN FILMS TRANSISTOR ARRAY SUBSTRATE AND FABRICATING METHOD THEREOF

This application claims the benefit of Korea Patent Application No. 2003-92703 filed on Dec. 17, 2003, which is hereby incorporated by reference.

BACKGROUND OF THE INVENTION

1. Field of the Invention

The present invention relates to a liquid crystal display, and more particularly to a thin film transistor array substrate and a fabricating method thereof.

2. Description of the Related Art

Generally, a liquid crystal displays (LCD) controls light transmittance of liquid crystal. The LCD includes a lower substrate provided with a thin film transistor array and an upper substrate provided with a color filter array that are attached to each other. A spacer for maintaining a cell gap between the two substrates is provided in a cell gap between the substrates. Liquid crystal fills in the rest of the cell gap. By using an electric field across the liquid crystal between a pixel electrode on the upper substrate and a common electrode on the lower substrate, a picture can be displayed.

The thin film transistor array includes thin film transistors provided at crossings of gate lines and data lines. An alignment film is coated on the thin film transistor array for aligning the liquid crystal. The color filter array is comprised of color filters for implementing a color, a black matrix for preventing a light leakage, and an alignment film coated thereon for the sake of an alignment of the liquid crystal.

FIG. 1 is a plan view showing a structure of the related art thin film transistor array, and FIG. 2 is a cross-section view of the thin film transistor array taken along the II-II' line in FIG. 1. Referring to FIG. 1 and FIG. 2, the thin film transistor array includes a gate line 2 and a data line 4 provided on a lower substrate 1 crossing each other. A gate insulating film 15 is between the gate line 2 and the data line 4. A thin film transistor 6 is provided at the crossing of the gate line 2 and the data line 4. The gate line 2 supplies gate signals and the data line 4 supplies data signals. A pixel electrode 14 is provided at a pixel area defined by the gate line 2 and the data line 4.

The thin film transistor 6 allows the pixel signal of the data line 4 to be charged and maintained on the pixel electrode 14 in response to the gate signal from the gate line 2. The thin film transistor 6 includes a gate electrode 8 connected to the gate line 2, a source electrode 10 connected to the data line 4 and a drain electrode 12 connected to the pixel electrode 14. The gate electrode 8 and source electrode 10 protrude into the pixel area 5.

The thin film transistor 6 further includes an active layer 17 overlapping the gate electrode 8. A gate insulating film 15 is between the active layer 17 and the gate electrode 8. The active layer 17 provides a channel between the source electrode 10 and the drain electrode 12. The active layer 17 also overlaps the data line 4. An ohmic contact layer 19 for making an ohmic contact with the source electrode 10 and the drain electrode 12 is further provided on the active layer 17.

The pixel electrode 14 is provided at the pixel area 5 and is in contact with the drain electrode 12 of the thin film transistor 6 via a contact hole going through a protective film 21. Thus, an electric field is formed between the pixel electrode 14 to which a pixel signal is supplied via the thin film transistor 6 and the common electrode (not shown) supplied with a reference voltage. Liquid crystal molecules between the lower substrate provided with the thin film transistor array and the upper substrate provided with the color filter array are rotated due to a dielectric anisotropy. Transmittance of a light transmitting the pixel area 5 is differentiated depending upon the rotation extent of the liquid crystal molecules, thereby implementing a gray level scale. The above-mentioned related art thin film transistor array has a problem in that, since the thin film transistor 6 is formed in such a manner to be within the pixel area 5, an effective pixel area for transmitting a light of the pixel area is reduced, which causes a reduction in an aperture ratio.

SUMMARY OF THE INVENTION

Accordingly, the present invention is directed to a thin film transistor array substrate and a fabricating method thereof that substantially obviates one or more of the problems due to limitations and disadvantages of the related art.

An object of the present invention to provide a thin film transistor array substrate and a fabricating method thereof to improve an aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor array substrate includes: a gate line provided on a substrate; a data line crossing the gate line; and a thin film transistor having a source electrode that is a portion of the data line that crosses the gate line and a drain electrode that overlapping the gate line.

In another aspect, a method of fabricating a thin film transistor array substrate, includes the steps of forming a gate line on a substrate, forming a data line crossing the gate line, and forming a thin film transistor having a source electrode that is a portion of the data line that crosses the gate line and a drain electrode that overlaps the gate line.

It is to be understood that both the foregoing general description and the following detailed description are exemplary and explanatory and are intended to provide further explanation of the invention as claimed.

BRIEF DESCRIPTION OF THE DRAWINGS

These and other objects of the invention will be apparent from the following detailed description of the embodiments of the present invention with reference to the accompanying drawings.

DETAILED DESCRIPTION OF THE PREFERRED EMBODIMENTS

Figure 1:
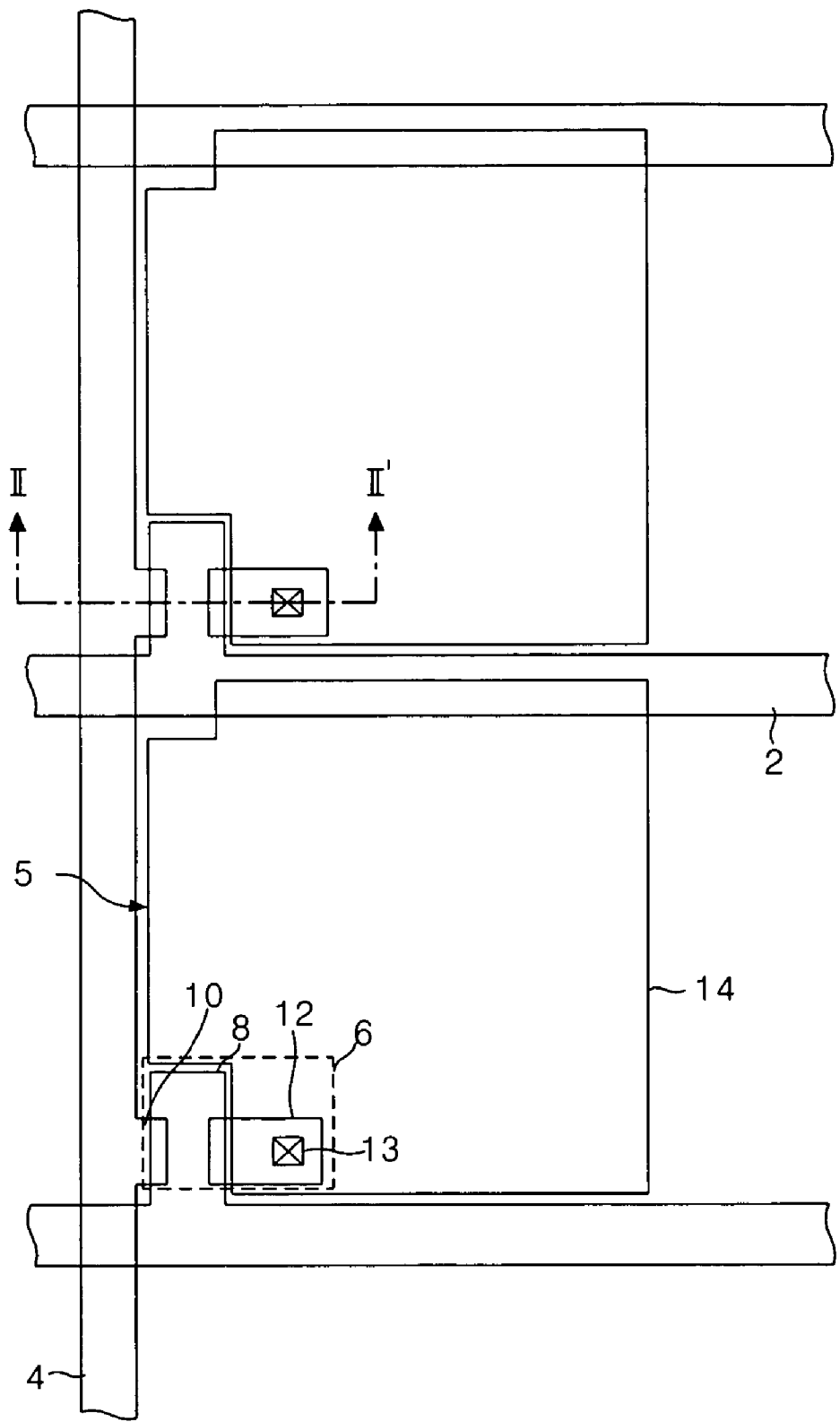
FIG. 1 is a plan view showing a structure of a related art thin film transistor array substrate.
Figure 2:
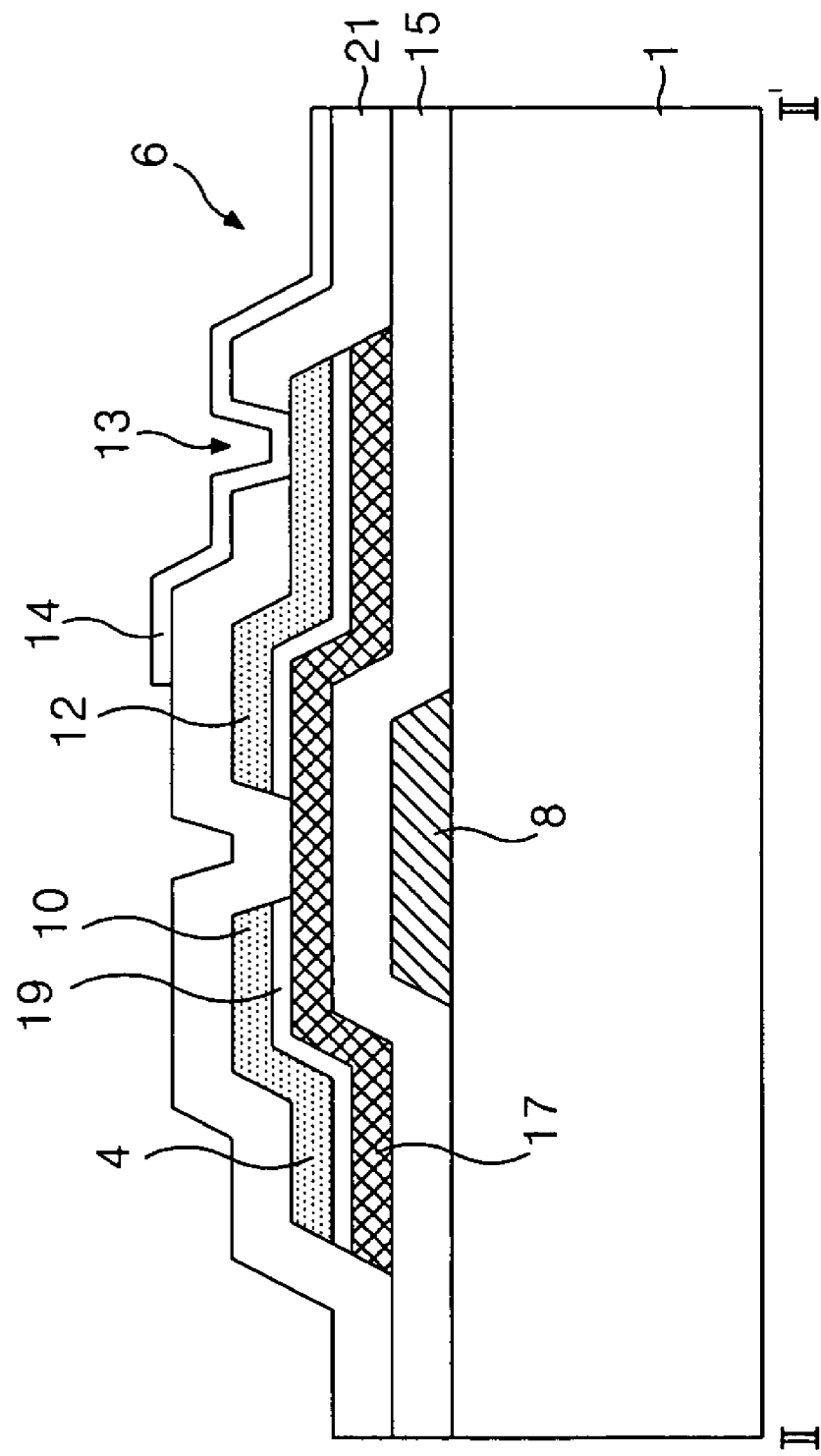
FIG. 2 is a cross-sectional view of the thin film transistor array substrate taken along the II-II' line in FIG. 1.

Reference will now be made in detail to the preferred embodiments of the present invention, examples of which are illustrated in the accompanying drawings. Hereinafter, the preferred embodiments of the present invention will be described in detail with reference to FIGS. 3 to 8. Like reference numerals will be used for like elements.

Figure 3:
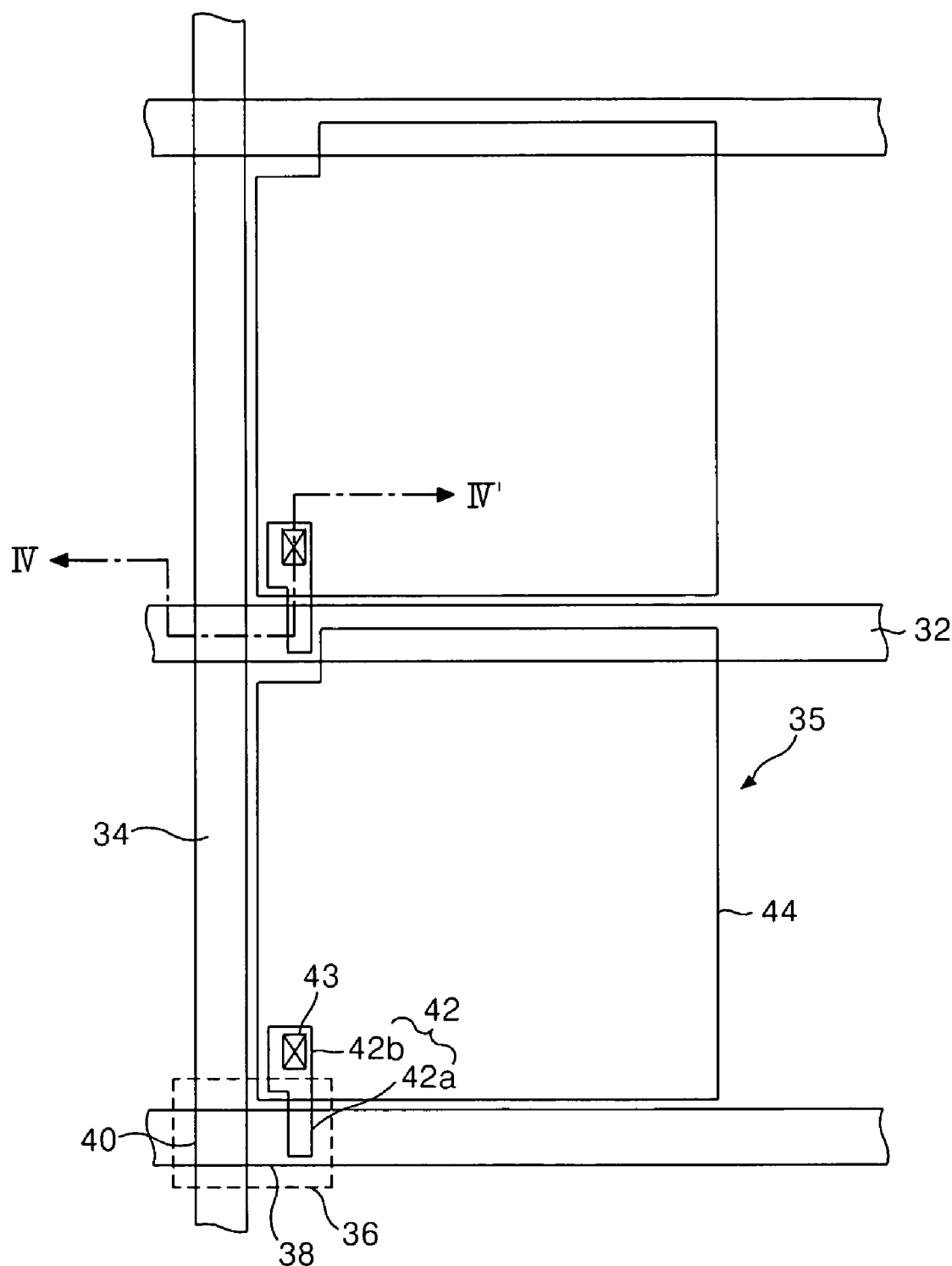
FIG. 3 is a plan view showing a structure of a thin film transistor array substrate according to an embodiment of the present invention.
Figure 4:
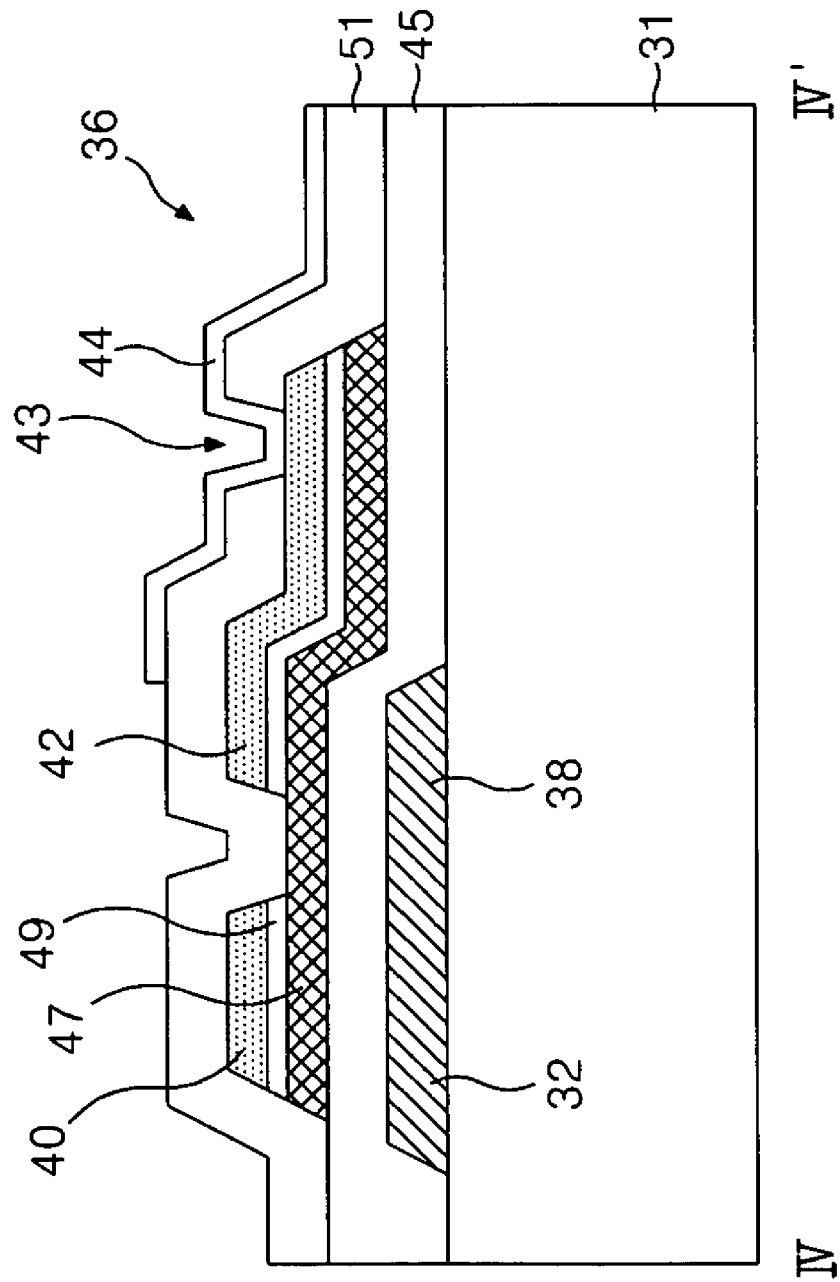
FIG. 4 is a cross-sectional view of the thin film transistor array substrate taken along the IV-IV' line in FIG. 3.

FIG. 3 is a plan view showing a structure of a thin film transistor array substrate according to an embodiment of the present invention. FIG. 4 is a cross-sectional view of the thin film transistor array substrate taken along the IV-IV' line in FIG. 3. Referring to FIG. 3 and FIG. 4, the thin film transistor array includes a plurality of gate lines 32 and a plurality of data lines 34 provided on a lower substrate 31 cross each other with a gate insulating film 45 therebetween. The gate lines 32 for supplying gate signals and the data lines 34 for supplying data signals define pixel areas 35 for transmitting light. The thin film transistor array substrate also includes a plurality of pixel electrodes 44 provided in the pixel areas. Further, a plurality of thin film transistors 36 are provided in the pixel areas overlapping the gate lines 32.

The thin film transistor 36 allows the pixel signal of the data lines 34 to be charged and maintained in the pixel electrodes 44 in response to the gate signal of the gate lines 32. In the thin film transistor 36, a portion of the data line 34 where the gate line 32 intersects is used as a source electrode. A portion of a drain electrode 42 overlaps the gate line 32. The drain electrode 42 includes a first drain electrode 42a opposed to the data line 34 at an area where it overlaps the gate line 32, and a second drain electrode 42b extending from the first drain electrode 42a, which contacts the pixel electrode 44. The gate line 32 is a conductive metal, such as an aluminum group metal or copper (Cu). The data line 34 is formed of a metal, such as molybdenum (Mo), tungsten (W), titanium (Ti), tantalum (Ta), copper (Cu) or chrome (Cr), etc. An area of the gate line 32 between the source electrode 40 and the drain electrode 42 is a gate electrode 38.

The thin film transistor 36 further includes an active layer 47 overlapping the gate electrode 38 and having the gate insulating film 45 between the active layer 47 and the gate electrode 38. The active layer 47 provides a channel between the source electrode 40 and the drain electrode 42. Both the active layer 47 and the ohmic contact layer 49 corresponding to the channel overlaps the gate line 32, as shown in FIG. 4.

The gate insulating film 45 is formed from an inorganic insulating material, such as silicon oxide ($SiO_x$), silicon nitride ($SiN_x$) or the like. The active layer 47 is formed from amorphous silicon or polycrystalline silicon. The ohmic contact layer 49 is formed from amorphous silicon or polycrystalline silicon.

The thin film transistor 36 is formed so as to protrude within the pixel area 35 only at a portion where a contact hole 43 for contacting the drain electrode 42 with the pixel electrode 44 is formed. Thus, the thin film transistor 36 protrudes within the pixel area only at a portion provided with the contact hole 43 of the drain electrode 42 while the rest of the thin film transistor 36 is formed over the gate line 32. Thus, the effective pixel area of the pixel area 44 is larger as compared to the effective pixel area of the related art.

The pixel electrode 44 in FIG. 4 is provided in the pixel area 35. The contact hole 43 in FIG. 4 goes through the protective film 51 in such a manner as to expose the drain electrode 42. The pixel electrode is in contact with a top surface of the drain electrode 42 of the thin film transistor 36 via the contact hole 43 going through a protective film 51.

Figure 5:
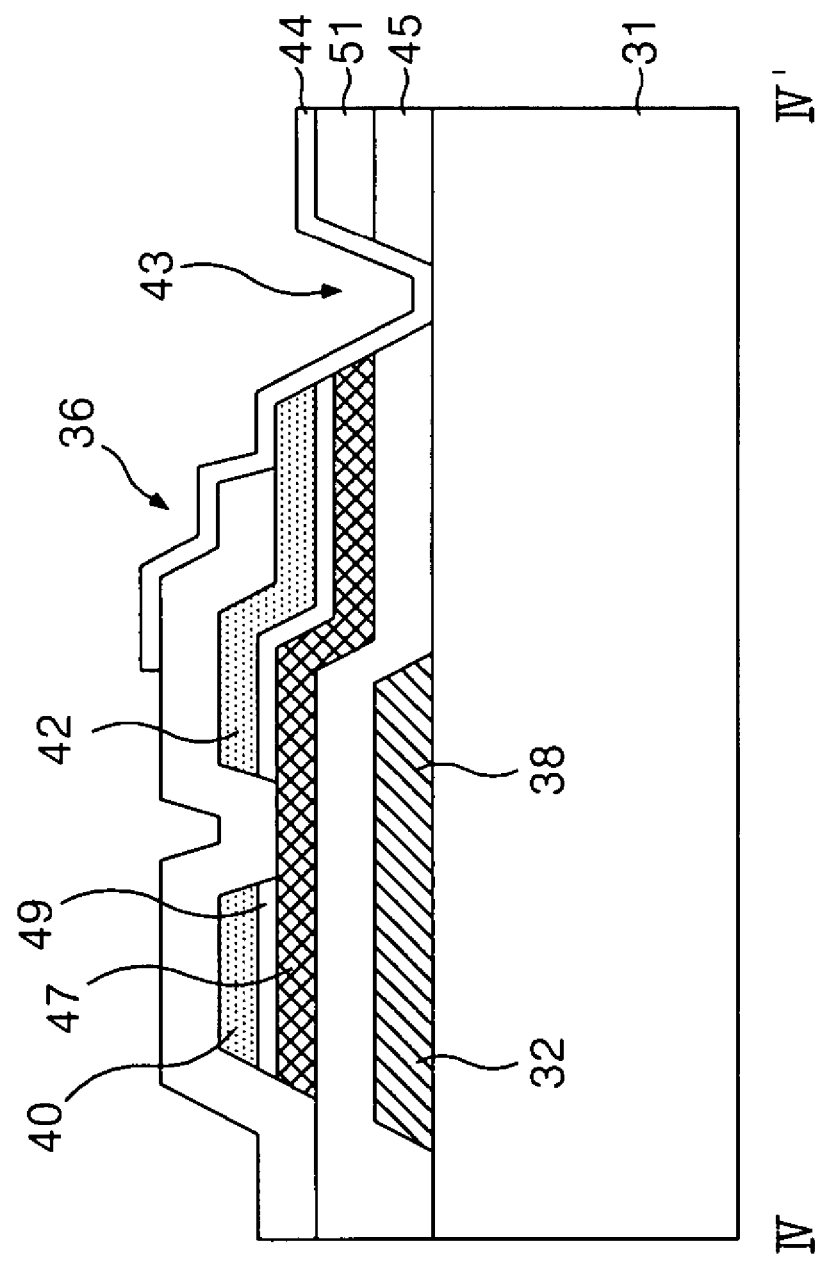
FIG. 5 is a cross-sectional view of the thin film transistor array substrate taken along the IV-IV' line in FIG. 3.

FIG. 5 is a cross-sectional view of the thin film transistor array substrate taken along the IV-IV' line in FIG. 3. The contact hole 43 expose a top surface and a side surface of the drain electrode 42, the side surfaces of the active layer 47, the ohmic contact layer 49 and the gate insulating film 45, to thereby expose the substrate 31, as shown in FIG. 5. In other words, the contact hole 43 shown in FIG. 5 is etched to expose the top surface and the side surface of the drain electrode 42. Thus, the pixel electrode 44 is in contact with both a top surface and a side surface of the drain electrode 42 of the thin film transistor 36 via the contact hole 43. The contact area between the pixel electrode 44 and the drain electrode 42 can be widely formed to improve the step coverage of the pixel electrode 44.

In the thin film transistor array substrate shown in FIG. 3, an electric field is formed between the pixel electrode 44 to which a pixel signal is supplied via the thin film transistor 36 and the common electrode (not shown) supplied with a reference voltage. Liquid crystal molecules between the lower substrate provided with the thin film transistor array and the upper substrate provided with the color filter array by such an electric field are rotated due to dielectric anisotropy. Transmittance of a light transmitting the pixel area 35 is differentiated depending upon the rotation extent of the liquid crystal molecules, thereby implementing a gray level scale.

As mentioned above, in the thin film transistor according to an embodiment of the present invention, a portion of the data line crossing the gate line is used as the source electrode. The drain electrode is spaced from the source electrode and a portion of the drain electrode overlaps with the gate line. Thus, an area between the source electrode of the gate line and the drain electrode becomes the gate electrode. As a result, the thin film transistor protrudes within the pixel area only at a portion where the contact hole to be in contact with the pixel electrode of the drain electrode is to be formed while the remaining portion of the thin film transistor is formed on the gate line. Accordingly, the thin film transistor according to embodiments of the present invention is formed in such a manner to overlap the gate line, thereby increasing an aperture ratio as compared to an area occupied by the thin film transistor of the related art. In other words, the black matrix of the upper substrate defining the pixel area is formed in such a manner to shield the gate line and the data line overlapping with the thin film transistor, thereby reducing an area occupied within the pixel area as compared to the related art black matrix formed in such a manner to shield the thin film transistor, the gate line and the data line.

Figure 6A:
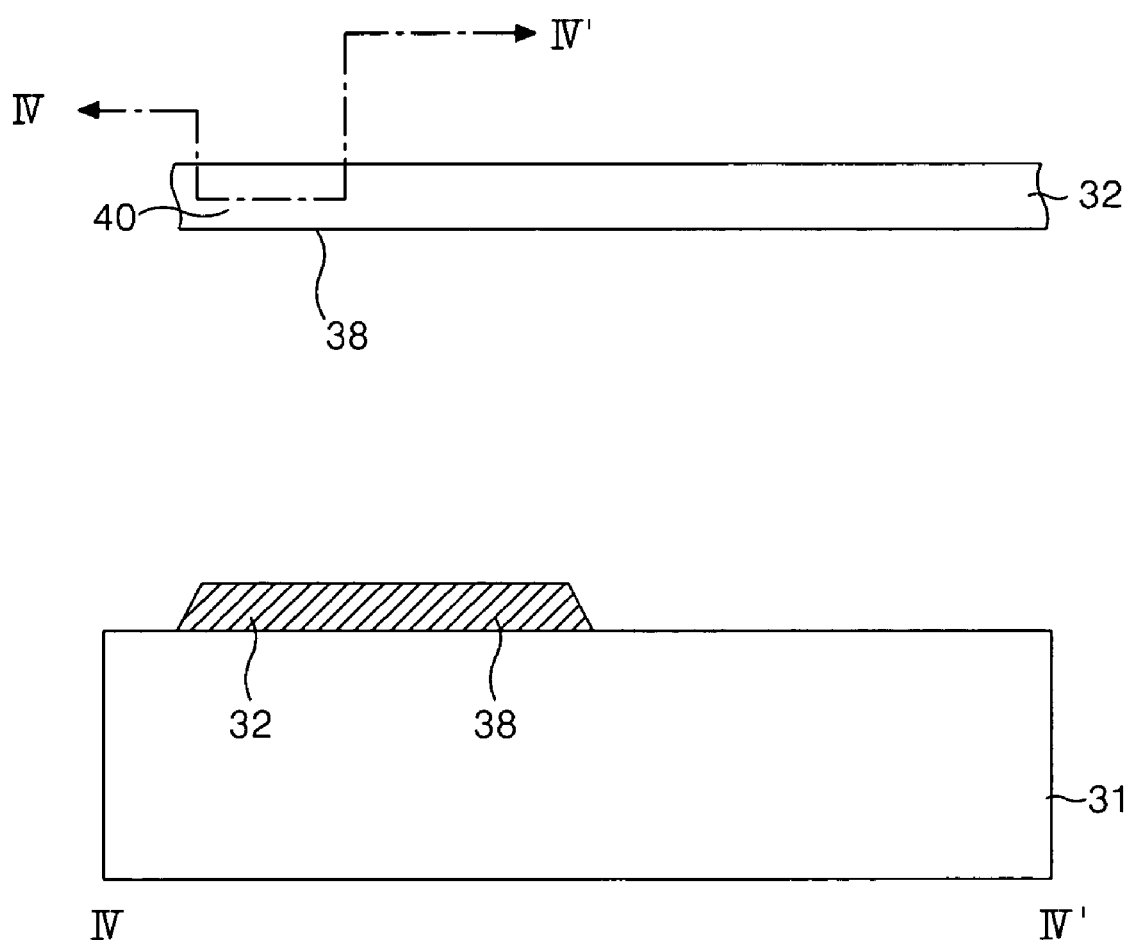
FIG. 6A to FIG. 6D are plan views and cross-sectional views showing the structure of the liquid crystal display panel according to an embodiment of the present invention.

FIG. 6A to FIG. 6D are plan views and section views showing the structure of the liquid crystal display panel according to an embodiment of the present invention. Referring to FIG. 6A, a first conductive pattern including the gate line 32 is provided on the lower substrate 31. More specifically, a gate metal layer is formed on the lower substrate 31 by a deposition technique, such as the sputtering or the like. Then, the gate metal layer is patterned by the photolithography and the etching process to thereby provide the gate line 32 including the gate electrode 38. The gate metal layer is formed from an aluminum group metal, for example.

Figure 6B:
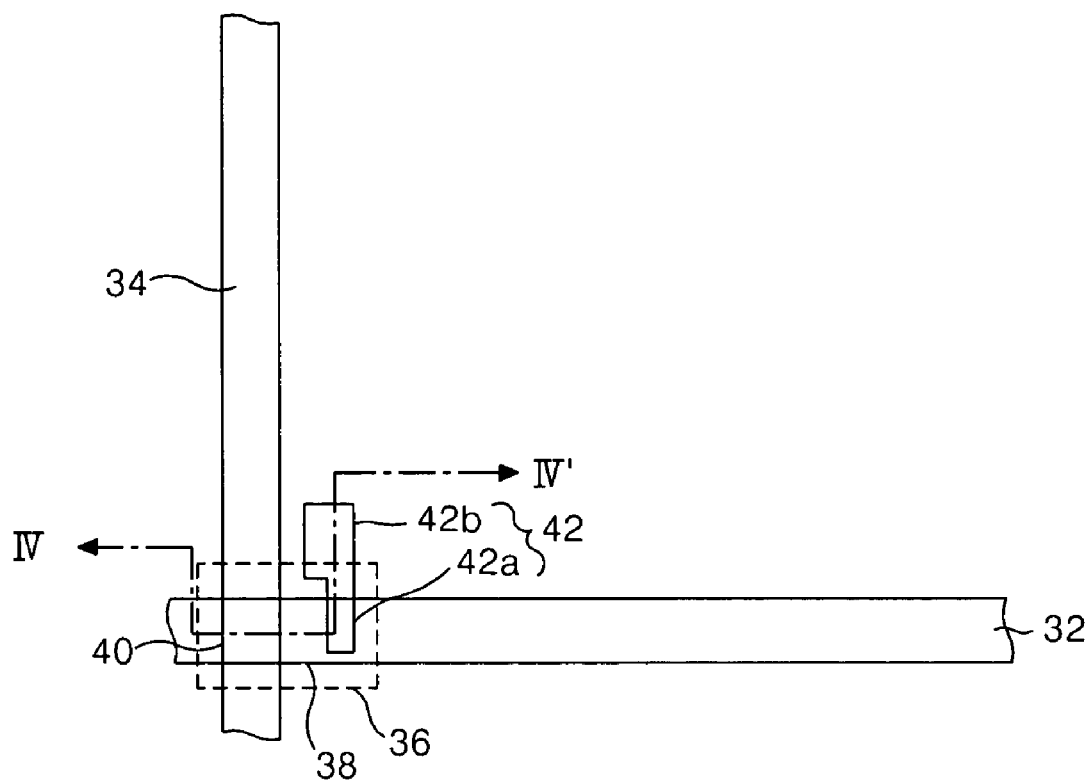
Figure 6B:
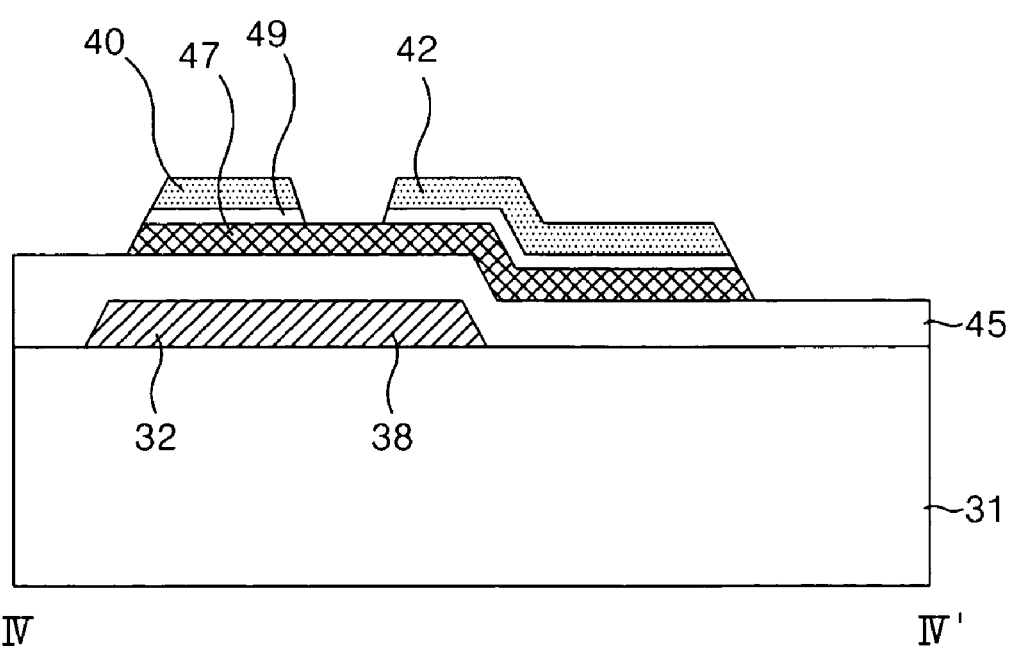

Referring to FIG. 6B, the gate insulating film 45 is coated onto the lower substrate 31 provided with the first conductive pattern group. Further, the semiconductor pattern including the active layer 47 and the ohmic contact layer 49 and the data line 34 including the source electrode 40 and the second conductive pattern group including the data line 34 are formed on the gate insulating film 45 by the second mask process. More specifically, an amorphous silicon layer, a doped amorphous silicon layer and a source/drain metal layer are sequentially formed on the lower substrate 31 provided with the first conductive pattern by a deposition technique, such as PECVD or sputtering. The gate insulating film 45 is made from an inorganic insulating material, such as silicon oxide ($SiO_x$), silicon nitride ($SiN_x$) or the like. The source/drain metal is made from molybdenum (Mo), titanium (Ti), tantalum (Ta) and a molybdenum alloy, for example.

Subsequently, the photo-resist pattern is formed on the source/drain metal layer by photolithography using a second mask. In this case, a diffractive exposure mask having a diffractive exposure part at the channel portion of the thin film transistor is used as the second mask. Thus, the photo-resist pattern at the channel portion has a height lower than the rest of the source/drain pattern.

Next, the source/drain metal layer is patterned by a wet etching process using the photo-resist pattern, to thereby provide the data line 34 having the source electrode 40 and the second conductive pattern group having the drain electrode 42 parallel to the data line 34. Thereafter, the doped amorphous silicon layer and the amorphous silicon layer are simultaneously patterned by a dry etching process using the same photo-resist pattern, to thereby from the ohmic contact layer 49 and the active layer 47.

The photo-resist pattern having a relatively low height is then removed from the channel portion by an ashing process and then the source/drain metal pattern of the channel portion and the ohmic contact layer 49 are etched by a dry etching process. Thus, the active layer 47 of the channel portion is exposed to disconnect the data line 34 with the drain electrode 42. Then, the photo-resist pattern having left on the second conductive pattern group is removed by a stripping process.

Figure 6C:
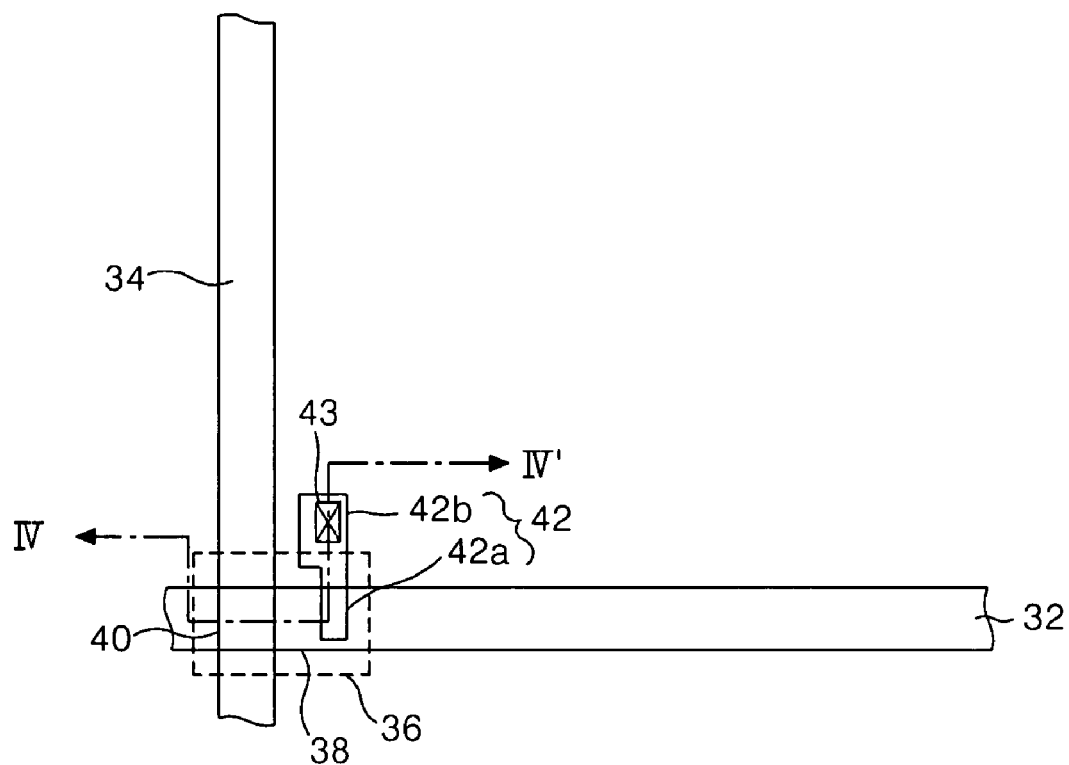
Figure 6C:
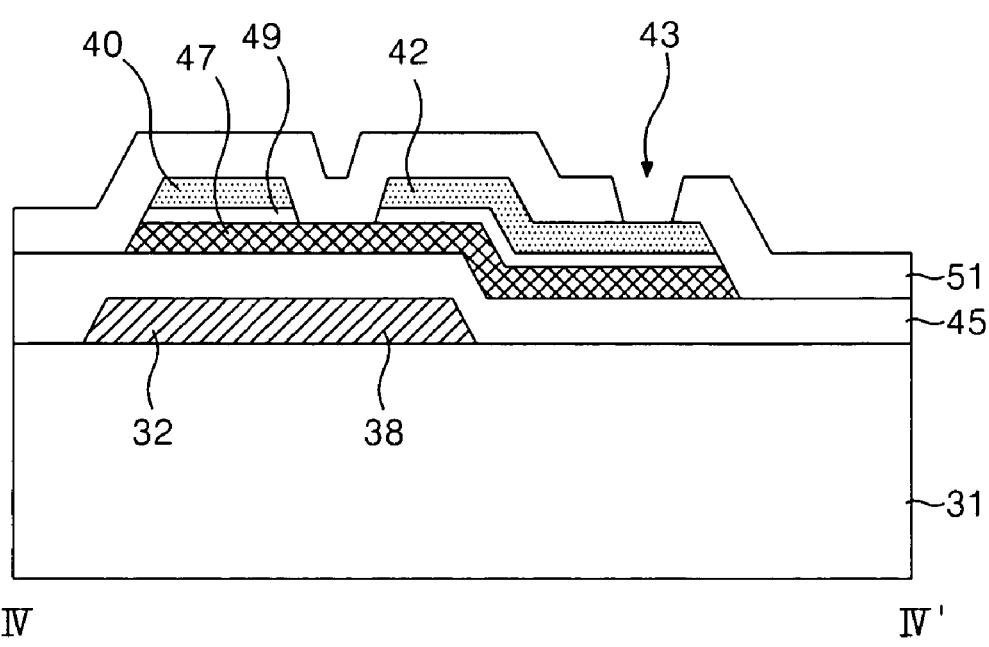

Referring to FIG. 6C, the protective film 51 including the contact hole 43 is formed on the gate insulating film 45 provided with the second conductive pattern group by the second mask process. More specifically, the protective film 51 is formed entirely on the gate insulating film 45 having the second conductive pattern group by a deposition technique, such as PECVD. Then, the protective film 51 is patterned by photolithography and etching processes, to thereby from the contact hole 43. The contact hole 43 goes through the protective film 51 or the protective film 51 and the gate insulating film 45 to expose the drain electrode 42 or the substrate. If a metal having a high dry etching ratio, such as molybdenum (Mo), is used as the source/drain metal, then the contact hole 43 goes through until the drain electrode 42 to expose the side surface thereof. The protective film 51 is formed of an inorganic insulating material identical to the gate insulating film 45, or an inorganic insulating material, such as an acrylic organic compound having a low dielectric constant.

Figure 6D:
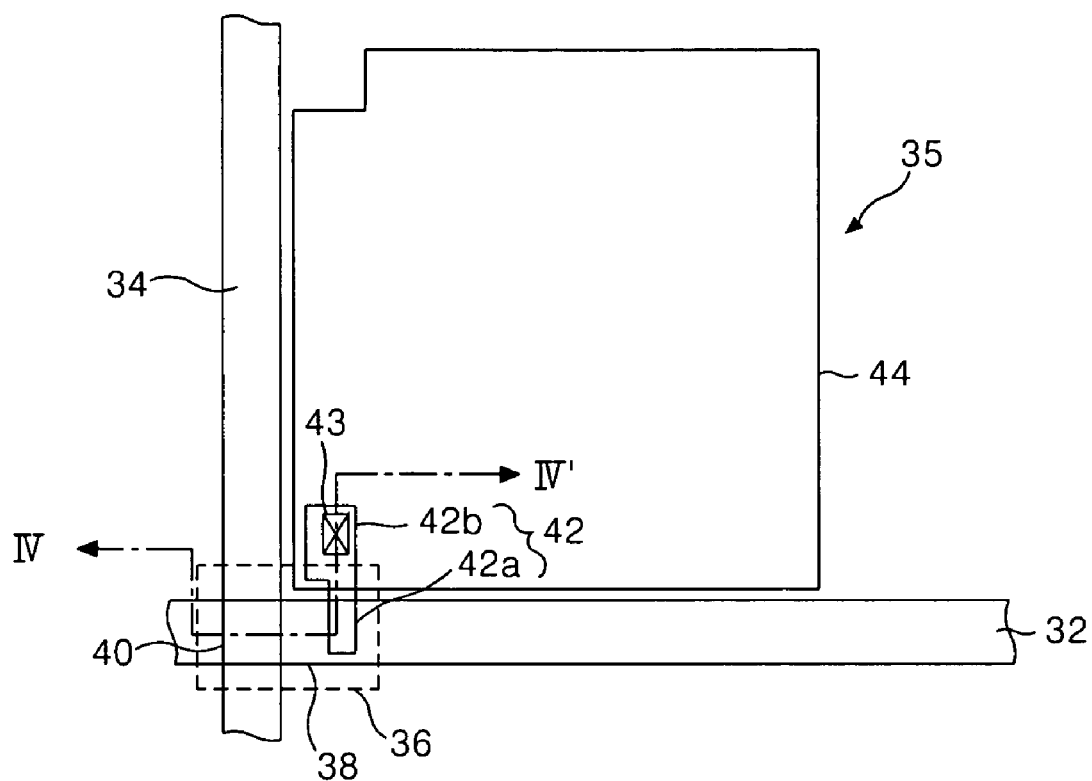
Figure 6D:
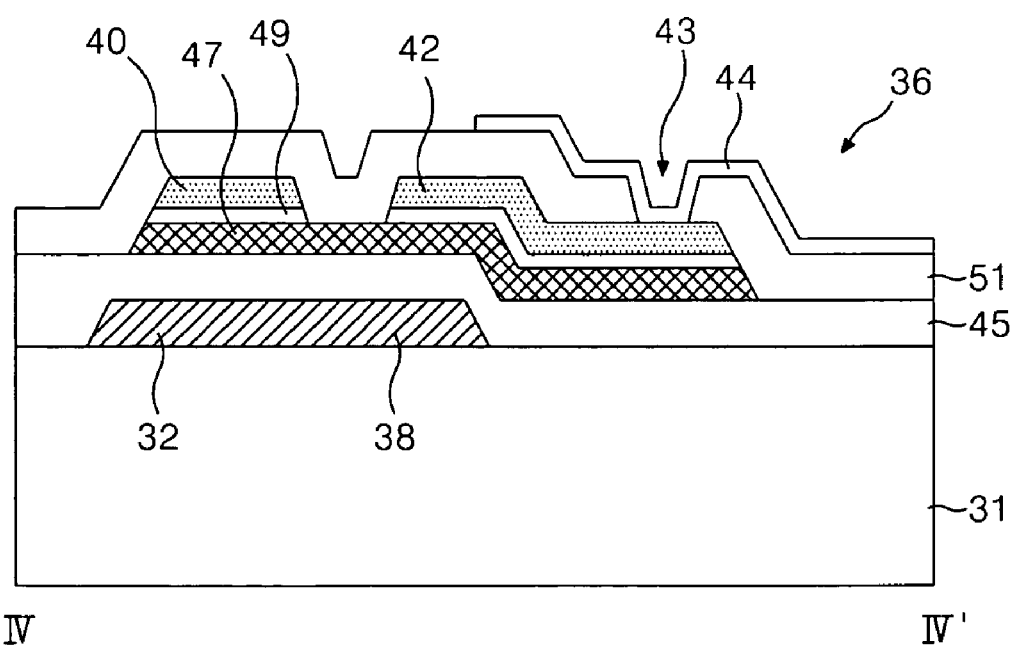

Referring to FIG. 6D, a third conductive pattern group having the pixel electrode 44 is formed on the protective film 51. More specifically, a transparent conductive film is coated onto the protective film 51 by a deposition method, such as sputtering. Then, the transparent conductive film is patterned by the photolithography and the etching process using a fourth mask to thereby provide the third conductive pattern group having the pixel electrode 44. The transparent conductive film is formed of one of indium-tin-oxide (ITO), tin-oxide(TO), indium-tin-zinc-oxide (ITZO) and indium-zinc-oxide (IZO).

Figure 7:
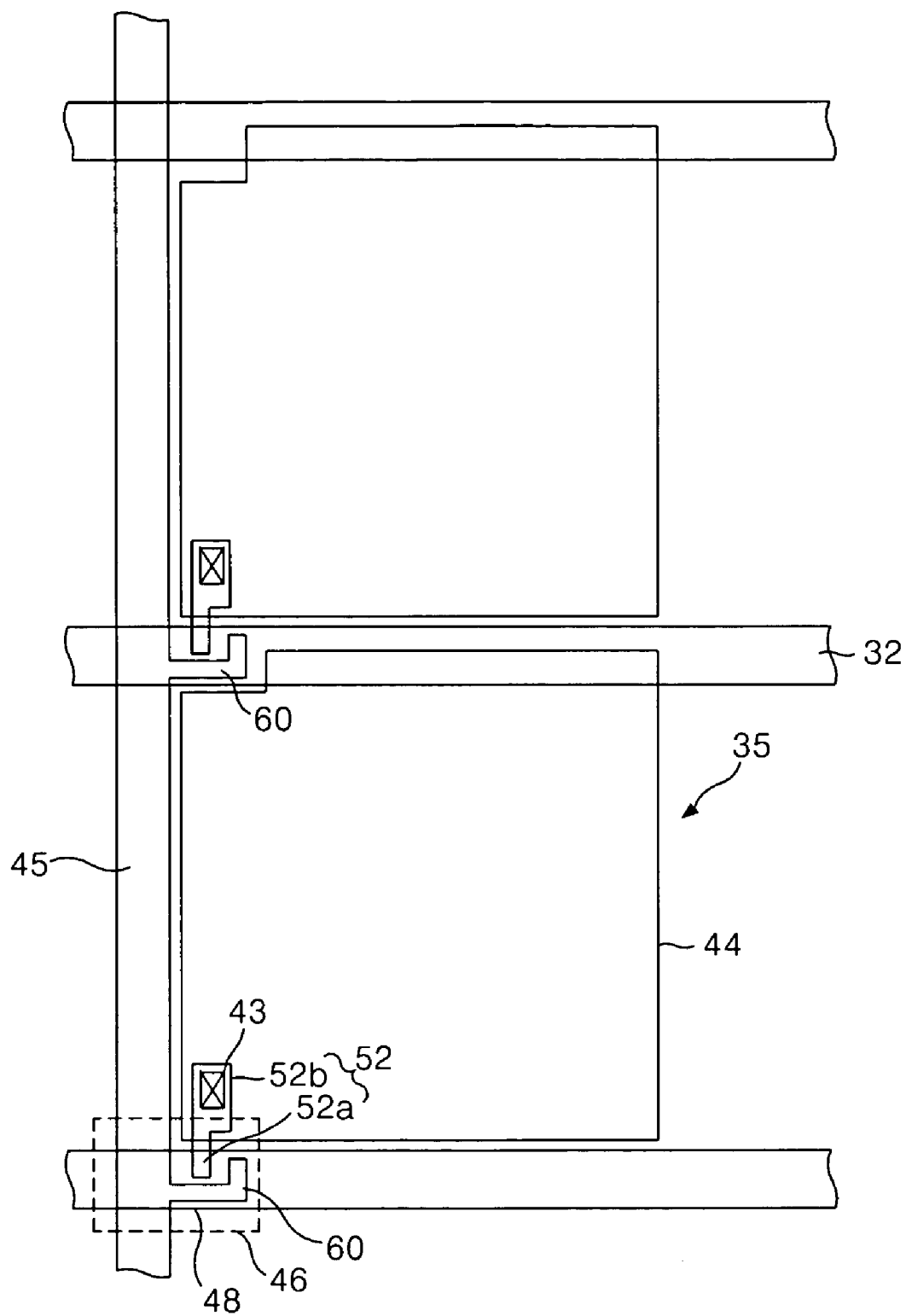
FIG. 7 is a plan view showing a structure of a thin film transistor array substrate according to an embodiment of the present invention having a source extension.

FIG. 7 is a plan view showing a structure of a thin film transistor array substrate according to an embodiment of the present invention having a source extension. Referring to FIG. 7, the thin film transistor array includes a plurality of gate lines 32 and a plurality of data lines 45. The gate lines 32 for supplying gate signals and the data lines 45 for supplying data signals define pixel areas 35 for transmitting light. The thin film transistor array substrate also includes a plurality of pixel electrodes 44 provided in the pixel areas. Further, a plurality of thin film transistors 46 are provided in the pixel areas overlapping the gate lines 32.

Each thin film transistor 46 includes a drain electrode 52 and source electrode 60 that both overlap the gate line 32. The drain electrode 52 includes a first drain electrode 52a opposed to the data line 45 at an area where it overlaps the gate line 32, and a second drain electrode 52b extending from the first drain electrode 52a, which contacts the pixel electrode 44. The source electrode 60 extends from the data line 45 and at least partially surrounds the first drain electrode 52a. An area of the gate line 32 between the source electrode 60 and the drain electrode 52 is a gate electrode 48.

The thin film transistor 46 is formed so as to protrude within the pixel area 35 only at a portion where a contact hole 43 for contacting the drain electrode 52 with the pixel electrode 44 is formed. Thus, the thin film transistor 46 protrudes within the pixel area 35 only at a portion provided with the contact hole 43 of the drain electrode 52 while the rest of the thin film transistor 46 is formed over the gate line 32. Further, the channel length of the thin film transistor 46 is increased by the source electrode 60 at least partially surrounding the first drain electrode 52a. The increased channel length increases the current capacity of the thin film transistor as well as the turn on speed. Thus, the effective pixel area of the pixel area 35 is larger and a voltage can be more quickly applied to the pixel electrode 44 as compared to the related art.

Figure 8:
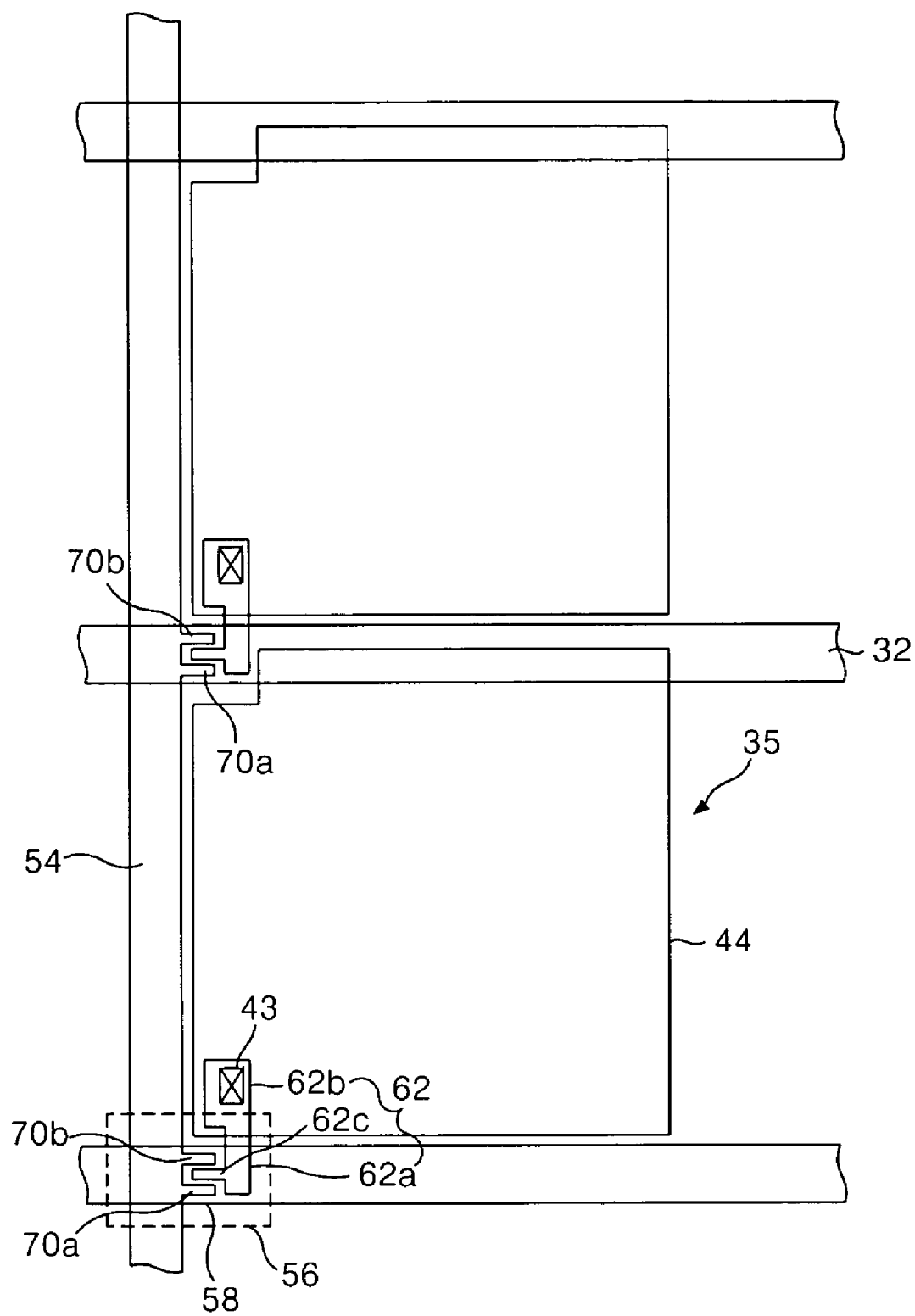
FIG. 8 is a plan view showing a structure of a thin film transistor array substrate according to another embodiment of the present invention having a source extension.

FIG. 8 is a plan view showing a structure of a thin film transistor array substrate according to another embodiment of the present invention having a source extension. Referring to FIG. 8, the thin film transistor array includes a plurality of gate lines 32 and a plurality of data lines 54. The gate lines 32 for supplying gate signals and the data lines 54 for supplying data signals define pixel areas 35 for transmitting light. The thin film transistor array substrate also includes a plurality of pixel electrodes 44 provided in the pixel areas. Further, a plurality of thin film transistors 56 are provided in the pixel areas overlapping the gate lines 32.

Each thin film transistor 56 includes a drain electrode 62 and source electrodes 70a and 70b that all overlap the gate line 32. The drain electrode 62 includes a first drain electrode 62a opposed to the data line 54 at an area where it overlaps the gate line 32, a second drain electrode 62b extending from the first drain electrode 62a that contacts the pixel electrode 44, and a third drain electrode 62c extending toward the data line 54 from the first drain electrode 62a. The width of the first drain electrode 62a in the direction of the gate line 32 is larger than the width of the third drain electrode 62c in the direction of the data line 54. The source electrodes 70a and 70b extend from the data line 54 and are respectively positioned along opposite sides of the third drain electrode 62c. The first and second source electrodes 70 and 70b are formed of the same length and are parallel to each other. An area of the gate line 32 between the source electrodes 70a and 70b, and the drain electrode 62 is a gate electrode 58.

The thin film transistor 56 is formed so as to protrude within the pixel area 35 only at a portion where a contact hole 43 for contacting the drain electrode 62 with the pixel electrode 44 is formed. Thus, the thin film transistor 56 protrudes within the pixel area only at a portion provided with the contact hole 43 of the drain electrode 62 while the rest of the thin film transistor 56 is formed over the gate line 32. Further, the channel length of the thin film transistor 56 is increased by the source electrodes 70a and 70b that are respectively along opposite sides of the third drain electrode 62c. The increased channel length increases the current capacity of the thin film transistor as well as the turn on speed. Thus, the effective pixel area of the pixel area 35 is larger and a voltage can be more quickly applied to the pixel electrode 44 as compared to the related art.

As described above, according to embodiments of the present invention, the thin film transistor is formed on the gate line, so that it becomes possible to prevent a reduction in the effective pixel area in the pixel area and thus to improve an aperture ratio.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor array substrate, comprising:
a gate line provided on a substrate;
a data line crossing the gate line;
an active layer disposed above the gate line; and
a drain electrode overlapping the gate line, the drain electrode including a first drain electrode opposed to the data line, a second drain electrode extending from the first drain electrode, and a third drain electrode extending toward the data line from the first drain electrode;
wherein a thin film transistor is defined by the active layer, a source electrode that is a portion of the data line that crosses the gate line, and the drain electrode overlapping the gate line, the source electrode including first and second source electrode extensions disposed over the gate line that project in a direction parallel to the gate line;
wherein a pixel electrode is connected to the thin film transistor and is in contact with both a top surface and a side surface of the drain electrode of the thin film transistor,
wherein a first portion of the pixel electrode is formed on a protective film on the drain electrode and a second portion of the pixel electrode is in contact with the substrate,
wherein a channel length of the thin film transistor is increased by the first and second source electrode extensions that are respectively along opposite sides of the third drain electrode,
wherein the first and the second source electrode extensions are formed of the same length and are parallel to each other,
wherein the first drain electrode is disposed aside the edges of the first and second source electrode extensions, and
wherein the third drain electrode is positioned in between and parallel to the first and second source electrode extensions,
wherein the width of the first drain electrode in the direction of the gate line is larger than the width of the third drain electrode in the direction of the data line.

2. The thin film transistor array substrate according to claim 1, wherein the active layer defines a channel between the first and second source electrode extensions and the third drain electrode.

3. The thin film transistor array substrate according to claim 2, wherein the active layer corresponding to the channel overlaps the gate line.

4. The thin film transistor array substrate according to claim 2, wherein the active layer is provided under the first and second source electrode extensions and the third drain electrode.

5. The thin film transistor array substrate according to claim 1, wherein the first drain electrode is parallel to the data line.

6. The thin film transistor array substrate according to claim 1, wherein the first and second source electrode extensions extend from the data line.

7. The thin film transistor array substrate according to claim 1, wherein the drain electrode including the first drain electrode, the second drain electrode and the third drain electrode is a single layer.

8. The thin film transistor array substrate according to claim 1, the first and second source electrode extensions disposed over the gate line that project in a direction parallel to the gate line are substantially identical in a shape.

* * * * *